United States Patent [19]

Rose et al.

[11] Patent Number: 5,148,102
[45] Date of Patent: Sep. 15, 1992

[54] APPARATUS FOR THE ELECTRICAL FUNCTION TESTING OF WIRING MATRICES, PARTICULARLY OF PRINTED CIRCUIT BOARDS

[75] Inventors: Thomas Rose; Detlef Hoffmann, both of Munich, Fed. Rep. of Germany

[73] Assignee: Siemens Aktiengesellschaft, Munich, Fed. Rep. of Germany

[21] Appl. No.: 768,632

[22] PCT Filed: Aug. 22, 1990

[86] PCT No.: PCT/DE90/00641

§ 371 Date: Oct. 10, 1991

§ 102(e) Date: Oct. 10, 1991

[87] PCT Pub. No.: WO91/02986

PCT Pub. Date: Mar. 7, 1991

[30] Foreign Application Priority Data

Aug. 23, 1989 [DE] Fed. Rep. of Germany ....... 3927842

[51] Int. Cl.$^5$ ............................................. G01R 31/02
[52] U.S. Cl. .................. 324/158 F; 324/459; 324/500; 324/536
[58] Field of Search .............. 324/158 F, 73.1, 459, 324/500, 501, 523, 536, 537, 538, 514

[56] References Cited

U.S. PATENT DOCUMENTS

| | | | |
|---|---|---|---|
| 4,507,605 | 3/1985 | Geisel | 324/536 |
| 4,600,878 | 7/1986 | Doemens et al. | 324/514 |
| 4,705,329 | 11/1987 | Doemens | 324/459 |
| 4,764,719 | 8/1988 | Zeh | 324/501 |
| 4,771,230 | 9/1988 | Zeh | 324/459 |
| 4,777,432 | 10/1988 | Doemens et al. | 324/459 |
| 4,891,578 | 1/1990 | Doemens | 324/158 F |
| 4,967,149 | 10/1990 | Doemens et al. | 324/500 |
| 5,032,788 | 7/1991 | Ringleb et al. | 324/501 |
| 5,039,938 | 8/1991 | Kohnen et al. | 324/73.1 |

FOREIGN PATENT DOCUMENTS 0102565 3/1984 European Pat. Off. .
0285798 10/1988 European Pat. Off. .
0322607 7/1989 European Pat. Off. .

OTHER PUBLICATIONS

Elektronik Produktion & Prüftechnik, Nov. 1979, H. J. Meixner "Federnde Prufspitzen-wichtiges Zubehör in der Prüftechnik".

*Primary Examiner*—Ernest F. Karlsen
*Attorney, Agent, or Firm*—Hill, Van Santen, Steadman & Simpson

[57] ABSTRACT

An apparatus for testing, for example, printed circuit boards having measuring locations connected by interconnects in which some of the measuring locations are closely spaced, includes a carrier plate having an arrangement of gas discharge channels each provided with an electrode for separate ionic contact with the more widely space measuring locations. The more closely space measuring locations are ionically contacted by a group gas discharge channel having a group electrode which extends over a group of the closely space measuring locations. The group gas discharge channel in one embodiment is an oblong hole in the carrier plate with a wire extending along its length. Current flow and voltage via the ionic contact is measured to identify faults in the interconnects between the measuring locations.

4 Claims, 2 Drawing Sheets

APPARATUS FOR THE ELECTRICAL FUNCTION TESTING OF WIRING MATRICES, PARTICULARLY OF PRINTED CIRCUIT BOARDS

BACKGROUND OF THE INVENTION

1. Field of the Invention

The invention is directed to an apparatus for the electrical function testing of wiring matrices, particularly of printed circuit boards, that comprise a plurality of first measuring locations arranged at a relatively great distance from one another and at least one group of second measuring locations arranged at a finer spacing from one another.

2. Description of the Related Art

In automatic testing units and testing adapters for unequipped and equipped printed circuit boards as well as for wiring matrices using solder or crimp techniques, the contacting of the selected measuring locations is usually undertaken via resilient test probes. The resilient test probes arranged in accordance with the grid dimension of a wiring matrix to be tested are secured with spring sleeves that are pressed into a carrier plate and into which the test probes are inserted. What are usually decisive in the selection of the test probes are the smallest distance of the measuring locations from one another as well as the current load across the diameter of the resilient test probes, whereby, however, 0.38 mm is cited as the lower limit dimension for the diameter (Productronic, May 1989, pages 36–40).

Conductivity and insulation measurements are implemented between the test locations formed by the grid points in accord with the layout, being implemented with the known apparatus for electrical function testing of printed circuit boards. Since the resilient test probes provided for contacting the test locations must be arranged in the grid of the printed circuit board, the realization of such apparatus increasingly encounters fundamental difficulties given a decreasing grid dimension of the printed circuit boards and areas of the printed circuit boards that are becoming larger. Thus, an arrangement of the resilient test probes in grid dimensions below 1 millimeter can hardly be governed in terms of precision mechanics given a reliable, mechanical contacting of the test locations. The number of leads and switch elements required also increases with the number of measuring locations which, for example, can amount to a hundred thousand, as a result whereof considerable apparatus-oriented outlay and correspondingly high costs are incurred. Moreover, the probability of a complete contacting of the printed circuit boards decreases considerably with the number of measuring locations.

EP-B-0 102 565 discloses an apparatus for the electrical functioning testing of wiring matrices wherein the previous standard ohmic contacting of the measuring locations is replaced by a non-touching, ionic contacting via gas discharge paths. To this end, a plurality of gas discharge channels provided with electrodes is introduced into a carrier plate that can be put in place on the wiring matrices, whereby the gas discharge channels arranged in the grid of the wiring matrices are open toward the measuring locations. When two selected measuring locations are electrically conductively connected to one another, for example by an interconnect, then the allocated gas discharge channels form two series-connected gas discharge paths that can be ignited by applying an adequately high voltage to the electrodes. A current transport that can be evaluated for testing purposes ensues with the ignition of the gas discharges. When the ignition of the gas discharges fails to occur or when an excessively low current flows after an ignition, then conclusions can be drawn regarding an interrupted connection or an electrically conductive connection that did not exist from the very outset between the selected measuring locations. When an AC voltage is overlaid on the voltage applied to the electrodes, then the change in current resulting therefrom can be measured phase-sensitive vis-a-vis the applied AC voltage and can be utilized for calculating the resistance of a connection existing between the selected measuring locations. The known apparatus thus enables conductivity and insulation measurements, whereby an extremely high reliability is achieved by avoiding ohmic contacts. In particular, wiring matrices having small grid dimensions of the measuring locations down to 0.1 mm can then be reliably tested with the principle of ionic contacting of the measuring locations via gas discharge channels that can be realized with extremely small dimensions.

In the apparatus disclosed by EP-B-0 102 565, thus, a separate gas discharge channel in the carrier plate is provided for every measuring location. This is particularly necessary when different wiring matrices are to be tested with the same apparatus.

There are, however, specific wiring matrices or printed circuit boards or sub-regions thereof that, for example, are intended for direct contacting of housing-free, integrated circuits and that have the following, characteristic structure. They contain regions of measuring locations having a spacing from one another that is even smaller than the spacing among the other measuring locations that are arranged at the standard spacing or, respectively, grid from one another. This slight spacing, for example, coincides with the connection grid of the afore-mentioned, housing-free, integrated circuits. Given such wiring matrices or printed circuit boards, exactly one conductive connection typically exists between a measuring location of the fine region and a measuring location of the region referred to here as the coarse region of the remaining measuring locations. The films of the MIKROPACK format for SMD-ICs of Siemens AG, Berlin and Munich, Germany, can be cited here as an example, the spacing of the measuring locations in the fine region therein being potentially smaller than 100 $\mu$m.

When the grid dimension of the measuring locations in the fine region falls below 100 $\mu$m, then the reliable contacting of these measuring locations via allocated gas discharge channels can present difficulties. Over and above this, the demands made of the adjustment precision of the carrier plates relative to the wiring matrix increase, this having to be better than 10 $\mu$m given a grid spacing of 100 $\mu$m. This leads either to a longer testing time or to higher manufacturing costs for the apparatus utilized for the function testing.

SUMMARY OF THE INVENTION

The object of the invention is to improve the apparatus for electrical function testing of printed circuit boards disclosed by EP-A-0 102 565 such that groups of measuring locations having spacings of less than 100 $\mu$m are adaptable in a simple way given justifiable manufacturing outlay and such that the demands made of the adjustment precision can be lowered.

This object is inventively achieved by the carrier plate that can be put in place onto the wiring matrices, in which carrier plate first gas discharge channels allocated to the first measuring locations and respectively provided with first electrodes and a group gas discharge channel allocated to the group of second measuring locations are introduced, whereby at least respectively two selected measuring locations of a wiring matrix can be ionically contacted via the allocated gas discharge channels and their electrodes.

In the apparatus of the invention, thus, the second measuring locations in the fine region are not contacted via respectively allocated, separate gas discharge channels. On the contrary, the group of second measuring locations is contacted in common via a single, expanded discharge channel—the group gas discharge channel—that covers the entire fine region. As a result thereof, the plurality of necessary electrodes, leads and coupling devices is also reduced to approximately half. A wiring matrix or a printed circuit board can also comprise two or more groups of second measuring locations, whereby a separate group gas discharge channel is then allocated to each of these groups.

Given a group of second measuring locations arranged in a row side-by-side, the allocated group gas discharge channel is preferably introduced into the carrier in the form of an oblong hole. An optimum matching of the geometry of the group discharge channel to the group of second measuring locations thereby derives.

It has also proven advantageous when the group electrode is formed by a line that crosses the group gas discharge channel. In this case, the continuation of the group electrode then serves as connecting line. Just like the manufacture of the first electrodes, the manufacture of the group electrodes can then be undertaken with techniques that are standard in the field of printed circuits or layer circuits.

In some instances, there are first measuring locations in the coarse region that are connected to a plurality of second measuring locations in the fine region. An electrical function testing is also enabled in these instances by a means for the quantitative acquisition of test current and test voltage between a first electrode and a group electrode and for calculating the overall area or the overall number of contacted, second measuring locations dependent on test current and test voltage. Here, thus, the dependency of the current-voltage characteristic from the cathode area is exploited.

BRIEF DESCRIPTION OF THE DRAWINGS

Exemplary embodiments of the invention are shown in the drawing and shall be set forth in greater detail below.

Shown are.

DETAILED DESCRIPTION OF THE PREFERRED EMBODIMENTS

Figure 1:
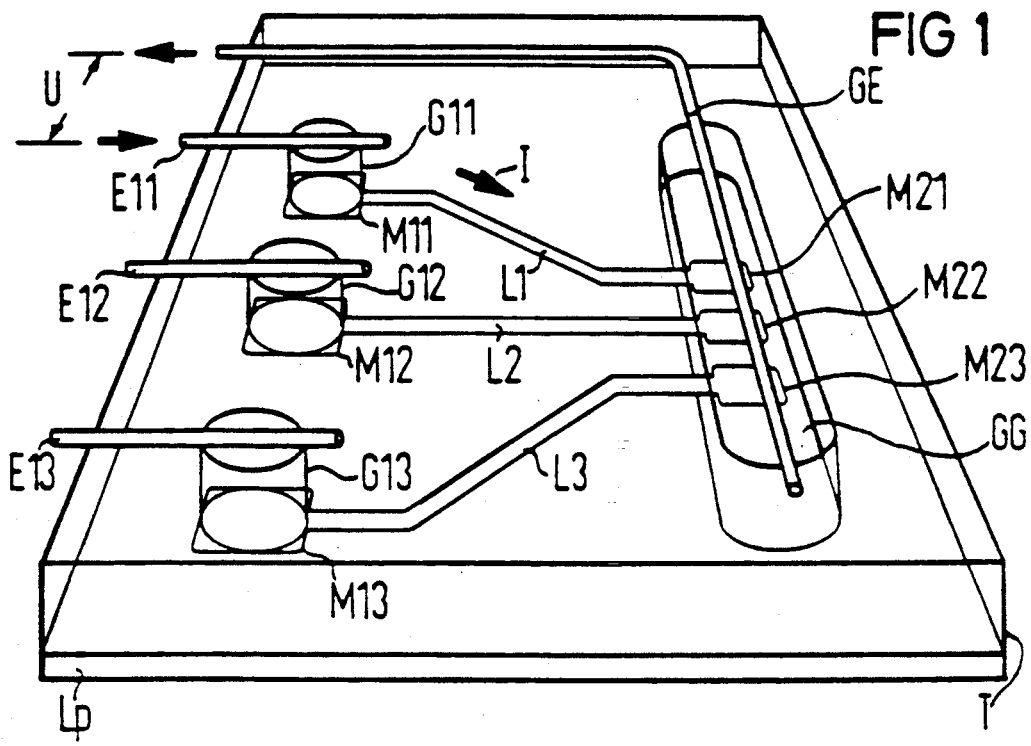
FIG. 1 the principle of an apparatus of the invention for the electrical function testing of printed circuit boards.

FIG. 1 shows a printed circuit board Lp under test comprising first measuring locations M11, M12 and M13 in the coarse grid region and comprising a group of second measuring locations M21, M22 and M23 in the fine grid region. The measuring locations M11 and M21, M12 and M22 as well as M13 and M23 are thereby electrically conductively connected to one another via interconnects L1 or, respectively, L2 or, respectively, L3. The printed circuit board Lp shown in FIG. 1 is merely intended to show the principle of the electrical function testing of the invention. In reality, the printed circuit board Lp can comprise, for example, a plurality of 100,000 first measuring locations and can also comprise several groups of second measuring locations.

For the electrical function testing of the printed circuit board Lp, a carrier plate T that is composed of an electrically insulating material such as, for example, glass is put in place on the upper side thereof. First gas discharge channels G11, G12 and G13 in the form of cylindrical holes are introduced into the carrier plate T, these first gas discharge channels being allocated to the first measuring locations M11 or, respectively, M12 or, respectively, M13 and, consequently, having the same grid as the first measuring locations. Each of the gas discharge channels G11, G12 and G13 is equipped with a separate, first electrode E11 or, respectively, E12 or, respectively, E13. In the illustrated exemplary embodiment, the first electrodes are fashioned as cylindrical wires that centrally cross the first gas discharge channels on the upper side of the carrier plate T.

A group gas discharge channel GG is also introduced into the carrier plate T in the form of an oblong hole, this group gas discharge channel GG being allocated to the totality of second measuring locations M21, M22 and M23 and covering the entire fine grid region. This group gas discharge channel GG is provided with a group electrode GE that is again fashioned as a cylindrical wire in the illustrated exemplary embodiment that centrally crosses the group gas discharge channel GG in longitudinal direction on the upper side of the carrier plate T.

When, for example, the electrically conductive connection L1 between the first measuring location M11 in the coarse grid region and the second measuring locations M21 in the fine grid regions is to be tested, then an adequately high test voltage U is applied to the first electrode E11 and to the group electrodes GE. Given an intact connection L1, the gas discharges ignite in the first gas discharge channel G11 between the first electrode E11 and the first measuring location M11 and in the group gas discharge channel GG between the second measuring location M21 and the group electrode GE. The gas discharge, so to speak, automatically finds its way from the group electrode GE to the second measuring location M21 whose appertaining, first measuring location M11 was contacted. Conclusions about the presence of the electrically conductive connection L1 can then be drawn from the resulting current flow I.

When the insulation between, for example, the interconnects L1 and L2 is to be tested, then the test voltage is applied to the first electrodes E11 and E12. Conclusions about a fault in the insulation can then be drawn from a current flow in this case.

Figure 2:
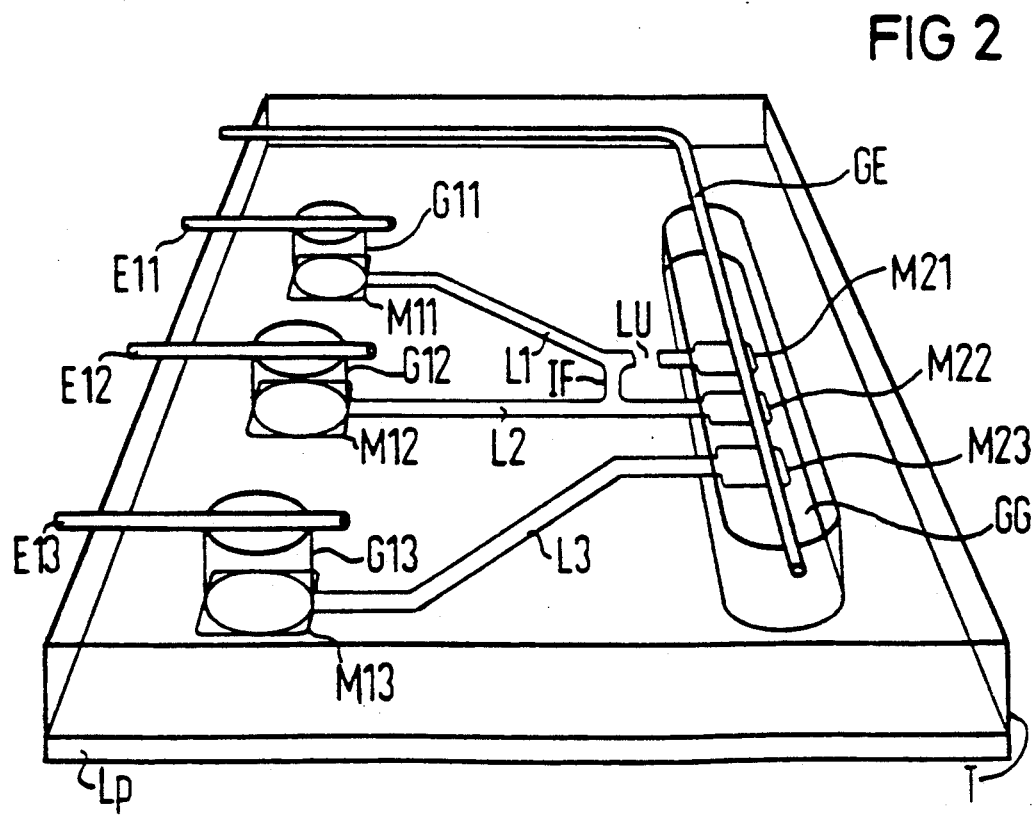
FIG. 2 the identification of a specific error of a printed circuit board under test.

FIG. 2 shows a specific fault wherein, first, the interconnect L1 comprises an interconnect interruption LU and, second, there is a faulty insulation IF between the interconnects L1 and L2. In this case, an intact connection L1 is simulated in the continuity test between the first electrode E11 and the group electrode GE. The fault, however, is reliably registered in the insulation test between the first electrodes E11 and E12.

Figure 3:
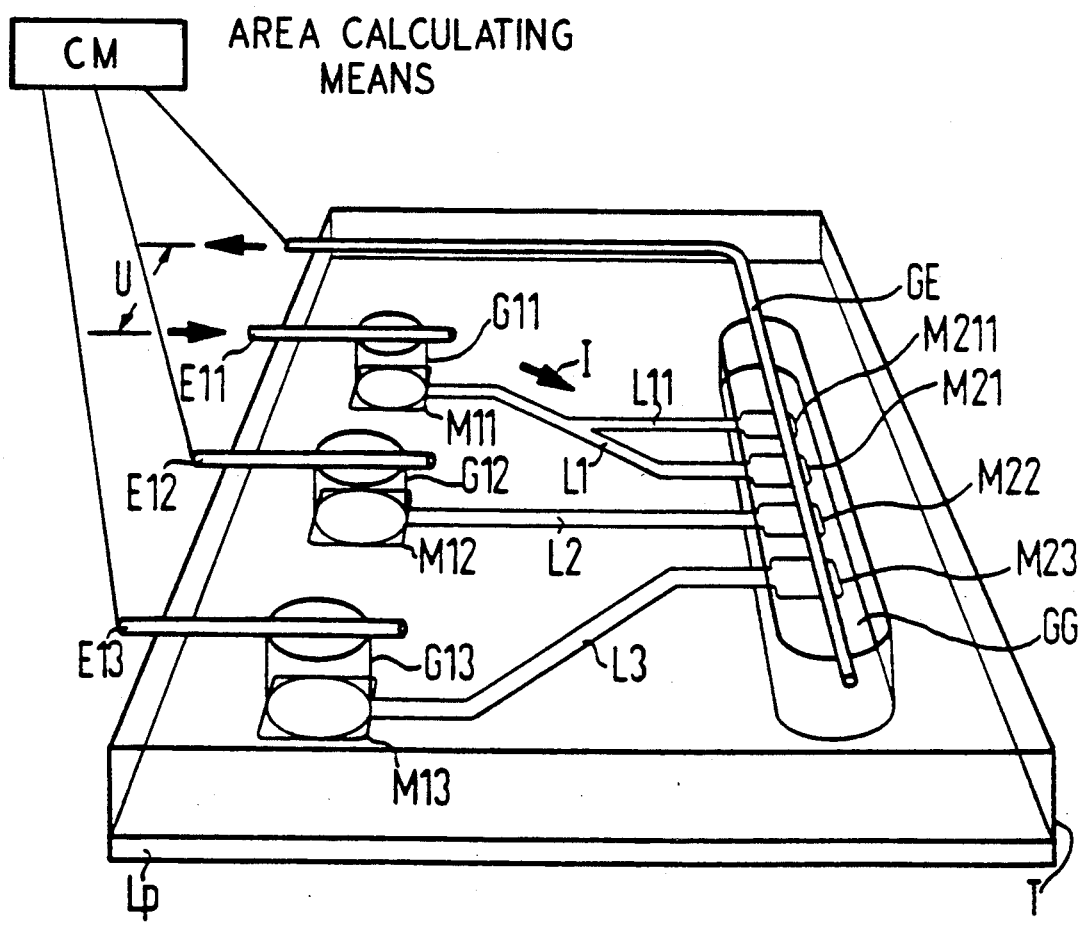
FIG. 3 the testing of a printed circuit board wherein measuring locations in the coarse region are connected to a plurality of measuring locations in the fine region.

According to FIG. 3, there are also wiring matrices or, respectively, printed circuit boards Lp having first measuring locations in the coarse grid region that are connected to a plurality of second measuring locations in the fine grid region. In the illustrated case, the first measuring location M11 is connected via the interconnect L1 to the second measuring location M21 and is connected via a branching interconnect L11 to the second measuring location M211. When a test voltage U is then applied between the first electrode E11 and the group electrode GE, then a current I also flows when only one of the connections L1 and L11 is intact. Since the current-voltage characteristic of the gas discharges, however, is dependent on the cathode area, a range of parameters can be found wherein, given a prescribed test voltage U, the test current I or, respectively, given a prescribed test current I, the test voltage U represents a measure for the overall area of the contacted, second measuring locations M211 and M21 in the group gas discharge channel GG. Given a known area of the individual, second measuring locations, the number of second measuring locations charged by the gas discharge can then be calculated by an area calculating means CM. The question of how many second testing locations are electrically conductively connected to a first measuring location can thus be answered. In the illustrated case, it can then be stated whether the first measuring location M11 is electrically conductively connected both to the second measuring location M21 as well as to the second measuring location M211.

A complete electrical function testing of wiring matrices or printed circuit boards is thus possible with the above-described apparatus, whereby the size of the discharge channels becomes independent of the fine grid. Given wiring matrices or printed circuit boards of the above-described type, it is thus possible to contact measuring locations having an arbitrarily small spacing from one another.

Further details regarding the electrical function testing of wiring matrices by ionic contacting of the measuring locations by gas discharge channels proceed from the afore-mentioned EP-B-0 102 565.

Although other modifications and changes may be suggested by those skilled in the art, it is the intention of the inventors to embody within the patent warranted hereon all changes and modifications as reasonably and properly come within the scope of their contribution to the art.

We claim:

1. An apparatus for the electrical function testing of wiring matrices that comprise a plurality of first measuring locations arranged at a relatively great spacing from one another and comprise at least one group of second measuring locations arranged at a finer spacing from one another, the apparatus comprising:
   a carrier plate that can be put in place onto the wiring matrices,
   first gas discharge channels in said carrier plate allocated to the first measuring locations, each of said gas discharge channels being provided with first electrodes, and
   a group gas discharge channel in said carrier plate allocated to the group of second measuring locations, said group gas discharge channel being provided with a group electrode
   so that at least respectively two selected measuring locations of a wiring matrix can be ionically contacted via the allocated gas discharge channels and their electrodes.

2. An apparatus according to claim 1, wherein the group comprises an oblong hole in said carrier plate for allocation to a group of second measuring locations arranged side-by-side in a row.

3. An apparatus according to claim 1, wherein the group electrode is a wire that crosses the group gas discharge channel.

4. An apparatus according to claim 1, further comprising: means for the quantitative acquisition of test current and test voltage between a first electrode and a group electrode and for calculating the overall area or the overall number of contacted, second measuring locations dependent on test current and on test voltage.

* * * * *